US008169771B2

(12) United States Patent
Defay et al.

(10) Patent No.: US 8,169,771 B2
(45) Date of Patent: May 1, 2012

(54) HIGH-STABILITY THIN-FILM CAPACITOR AND METHOD FOR MAKING THE SAME

(75) Inventors: Emmanuel Defay, Voreppe (FR); Julie Guillan, Grenoble (FR); Serge Blonkowski, Meylan (FR)

(73) Assignees: Commissariat a l'Energie Atomique, Paris (FR); STMicroelectronics (Crolles 2) S.A.S., Crolles (FR)

(*) Notice: Subject to any disclaimer, the term of this patent is extended or adjusted under 35 U.S.C. 154(b) by 441 days.

(21) Appl. No.: 12/311,529

(22) PCT Filed: Oct. 16, 2007

(86) PCT No.: PCT/FR2007/001701
§ 371 (c)(1),
(2), (4) Date: Apr. 2, 2009

(87) PCT Pub. No.: WO2008/047000
PCT Pub. Date: Apr. 24, 2008

(65) Prior Publication Data
US 2010/0002358 A1    Jan. 7, 2010

(30) Foreign Application Priority Data
Oct. 19, 2006 (FR) .................... 06 09177

(51) Int. Cl.
*H01G 4/06* (2006.01)
*H01G 4/10* (2006.01)
(52) U.S. Cl. ........................ 361/313; 361/322
(58) Field of Classification Search ............... 361/313, 361/322
See application file for complete search history.

(56) References Cited

U.S. PATENT DOCUMENTS

| 5,390,072 A | 2/1995 | Anderson et al. |
| 5,978,207 A | 11/1999 | Anderson et al. |
| 6,150,684 A | 11/2000 | Sone |
| 6,190,924 B1 | 2/2001 | Lee |
| 6,495,878 B1 | 12/2002 | Hayashi et al. |
| 2003/0184952 A1 | 10/2003 | Baniecki et al. |
| 2006/0017136 A1 | 1/2006 | Won et al. |

FOREIGN PATENT DOCUMENTS

| EP | 1 078 998 A2 | 2/2001 |
| EP | 1 517 360 A2 | 3/2005 |
| JP | A-04-331714 | 11/1992 |
| JP | 09-202621 | 8/1997 |
| JP | A-2000-331877 | 11/2000 |

OTHER PUBLICATIONS

Kim et al., "Improvement of Voltage Linearity in High-κ MIM Capacitors Using $HfO_2$-$SiO_2$ Stacked Dielectric," IEEE Electron Device Letters, vol. 25, No. 8, 2004, pp. 538-540.
Jia et al., "Low leakage current $BaTiO_3$ thin film capacitors using a multilayer construction," Thin Solid Films, vol. 259, No. 2, 1995, pp. 264-269.

*Primary Examiner* — Jayprakash N Gandhi
*Assistant Examiner* — Arun Ramaswamy
(74) *Attorney, Agent, or Firm* — Oliff & Berridge, PLC

(57) ABSTRACT

The dielectric of a capacitor is formed by superposition of at least two thin layers made from the same metal oxide, respectively in crystalline and amorphous form and respectively presenting quadratic voltage coefficients of capacitance of opposite signs. The respective thicknesses $d_a$ and $d_c$ of the amorphous and crystalline thin layers comply with the following general formulas:

$$d_a = \frac{\varepsilon_0 \varepsilon_a}{C_{s0}} \left( \frac{1}{1 - \left(\frac{\varepsilon_c}{\varepsilon_a}\right)^2 \frac{\gamma_a}{\gamma_c}} \right) \text{ and } d_c = \frac{\varepsilon_0 \varepsilon_c}{C_{s0}} \left( \frac{1}{1 - \left(\frac{\varepsilon_a}{\varepsilon_c}\right)^2 \frac{\gamma_c}{\gamma_a}} \right)$$

in which $\varepsilon_0$ corresponds to the electric constant, $\varepsilon_c$ and $\varepsilon_a$ correspond to the relative permittivity of the metal oxide respectively in crystalline form and in amorphous form, $C_{s0}$ corresponds to the total surface capacitance at zero field, and $\gamma_c$ and $\gamma_a$ correspond to the quadratic coefficient of capacitance with respect to the electric field of the metal oxide respectively in crystalline form and in amorphous form.

9 Claims, 4 Drawing Sheets

HIGH-STABILITY THIN-FILM CAPACITOR AND METHOD FOR MAKING THE SAME

BACKGROUND OF THE INVENTION

The invention relates to a thin-film capacitor and methods for making a thin-film capacitor.

STATE OF THE ART

At present, several types of capacitors can be integrated in devices used in the microelectronics field. In a general manner, the following can be cited:

decoupling capacitors which enable stray high frequencies to be eliminated on the power supply lines of current devices, connecting capacitors which enable the direct voltage between two functional units to be blocked, and analog capacitors or RF capacitors located in the functional units and having to present a very well-defined capacitance value.

These different types of capacitors have to present very precise properties according to their field of application. In particular, two characteristic parameters of a capacitor depending on the dielectric used are important: the value of the surface capacitance Cs and the variation of the capacitance according to the bias that is applied to the capacitor.

The surface capacitance Cs corresponds to the ratio between the capacitance value of the capacitor and its surface. Thus, for a planar capacitor, i.e. a capacitor formed by a stack of thin films, the surface capacitance Cs is equal to $\in_0 \cdot \in_r /d$, $\in_0$ corresponding to the electric constant, $\in_r$ corresponding to the relative permittivity of the material used as dielectric, and d corresponding to the thickness of the dielectric. Therefore the greater the value of the surface capacitance Cs, the smaller the size of the capacitor for a given capacitance value. This property is therefore interesting to gain space in the device containing the capacitor, in particular for capacitors presenting a high capacitance, such as coupling capacitors and decoupling capacitors. For this type of capacitors, the capacitance value can in fact reach several tens of nanoFarads (nF) and the surface capacitance Cs sought for can reach several hundreds of nF/mm². For similar capacitances, the typical capacitance value is comprised between 1 picoFarad (pF) and a few tens of pF and the surface capacitance sought for is comprised between 1 femtoFarad/µm² (fF/µm²) and 10 fF/µm².

The variation of the capacitance according to the bias applied to the capacitor corresponds to the variation of the capacitance according to the direct voltage applied to the terminals of the capacitor even if, in operation, the nature of the applied voltage can be DC, AC or both. In the case of analog capacitors in particular, the capacitance value has to be as stable as possible, whatever the bias applied. This relative stability of the capacitance variation according to the applied bias then corresponds to a certain linearity of the capacitor.

The capacitance variation can be modeled according to the bias V applied to the terminals of the capacitor by the following formula (1):

$$\frac{C}{C_0} = \alpha V^2 + \beta V + 1 \quad (1)$$

where C represents the capacitance value of the capacitor, $C_0$ represents the capacitance value of the capacitor when the applied bias is zero, α is a quadratic voltage coefficient of capacitance (or quadratic VCC) and β is a linear voltage coefficient of capacitance (or linear VCC).

To minimize the variation of the capacitance C with respect to the bias V in an analog capacitor, the values of coefficients α and β have to be close to zero. The coefficients α and β are often defined with respect to the applied voltage as the specification of a capacitor is in general given in voltage. Thus, for an analog capacitor, the required values are about 100 ppm/V² for coefficient α and 100 ppm/V for coefficient β, for a maximum voltage of 5.5V.

The value of coefficient β is not determinant to reduce the variation of capacitance C with respect to bias V. The effect of coefficient β can effectively be easily cancelled by using two capacitors in parallel, connected head-to-tail. The capacitors are therefore added to one another and the linear effect is suppressed.

On the other hand, the value of coefficient α is determinant as there is no way of cancelling this quadratic effect by the system architecture. In the case of planar capacitors having a surface capacitance of up to 2 fF/µm², the commonly used dielectric is silicon oxide ($SiO_2$) and its relative dielectric constant $\in_r$ is 3.9. Therefore, for a surface capacitance Cs of 2 fF/µm², the thickness of the silicon oxide dielectric is about 17 nm and the coefficients α and β respectively have values of about 100 ppm/V² and 100 ppm/V. The values of coefficients α and β are in this case satisfactory. However, when the integration density is increased, the surface capacitance Cs has to be increased. However, to achieve a surface capacitance Cs of 5 fF/µm², the thickness of the silicon oxide dielectric should be greatly reduced, in particular to around 7 nm. But for this thickness, at 5.5V, coefficient α becomes greater than 100 ppm/V². Furthermore, the smaller the thickness, the higher the leakage currents. Silicon oxide is therefore never used for surface capacitances of more than 2 fF/µm².

It has been proposed to replace silicon oxide by another dielectric material. Typically it can be replaced by $HfO_2$, $Ta_2O_5$, $Y_2O_3$, $ZrO_2$ or $Al_2O_3$. These materials in fact present a relative dielectric constant comprised between 9 for $Al_2O_3$ and 25 for $Ta_2O_5$ and enable a high surface capacitance to be obtained. Coefficients α and β are however too high. For example, $HfO_2$ presents a coefficient α of about 400 ppm/V² for a surface capacitance of 5 fF/µm².

To obtain a high surface capacitance while improving the linearity of analog capacitors, Sun Jung Kim et al., in the article "Improvement of Voltage Linearity in High-K MIM Capacitors Using $HfO_2$—$SiO_2$ Stacked Dielectric" (IEEE Electron Device Letters, Vol. 25, N° 8, August 2004, p 538-540) proposed to cancel the effect of the quadratic coefficient α by using a stack comprising a thin layer of $SiO_2$ with a thickness of 4 nm and a thin layer of $HfO_2$ with a thickness of 12 nm as dielectric. Silicon oxide and hafnium oxide do in fact present quadratic coefficients of VCC of opposite signs. With a particular choice of thickness for the two thin layers, a dielectric stack presenting a quadratic coefficient α close to zero (α=14 ppm/V²) and a high surface capacitance (Cs=6 fF/µm²) can be obtained.

In the same way, in the patent application US2006/0017136, the dielectric of an analog capacitor is formed by a stack of a bottom thin layer presenting a negative quadratic voltage coefficient of capacitance, an intermediate thin layer presenting a positive quadratic voltage coefficient of capacitance and a top thin layer presenting a negative quadratic voltage coefficient of capacitance. The bottom and top thin layers are for example made of $SiO_2$ or $Ta_2O_5$ whereas the intermediate thin layer is for example made of $HfO_2$, $ZrO_2$ or $LaO_3$.

In the patent application EP1517360, the dielectric is also formed by three thin layers of high-k material. The bottom and top thin layers present a quadratic voltage coefficient of capacitance the absolute value of which is relatively lower than that of the quadratic voltage coefficient of capacitance of the intermediate layer. The intermediate layer on the other hand presents a relatively lower leakage current than that of the top and bottom layers.

The capacitance of such capacitors comprising several dielectric thin layers formed by materials having different quadratic coefficients of VCC is stable with respect to the applied voltage bias. Fabrication thereof is however difficult to implement.

OBJECT OF THE INVENTION

One object of the invention is to provide a thin-film capacitor having a high surface capacitance and an improved voltage stability while being easy to manufacture.

According to the invention, this object is achieved by appended claims 1 to 3 and by claims 14 to 16.

It is a further object of the invention to provide a method for making a thin-film capacitor having a high surface capacitance and an improved voltage stability that is easy to implement.

According to the invention, this object is achieved by appended claims 4 to 6 and 7 to 13.

BRIEF DESCRIPTION OF THE DRAWINGS

Other advantages and features will become more clearly apparent from the following description of particular embodiments of the invention given for non-restrictive example purposes only and represented in the accompanying drawings, in which.

DESCRIPTION OF PARTICULAR EMBODIMENTS

A thin-film capacitor, and more particularly a thin-film analog capacitor, comprises at least two electrodes separated by a dielectric.

In a first embodiment, the dielectric is formed by superposition of at least two thin layers made from the same metal oxide, respectively in crystalline and amorphous form. More particularly, the metal oxide is a perovskite material. As can be shown experimentally, in their crystalline phase, perovskite materials in fact present a quadratic voltage coefficient of capacitance (coefficient $\alpha$) of opposite sign to that presented by at least one amorphous phase. More particularly, the crystalline form of the perovskite material presents a negative coefficient $\alpha$ whereas, for the amorphous form, coefficient $\alpha$ is positive.

The perovskite material can for example be chosen from the following perovskite materials: $SrTiO_3$ also known under the name of STO, $(PbZr)TiO_3$ also known under the name of PZT, $(PbMg)NbO_3$—$PbTiO_3$, $BaTiO_3$ also known under the name of BTO, $(K, Na)NbO_3$ also known under the name of KNN, $Ba_2Na_2Nb_5O_{15}$ also known under the name of BSN and $BaZn_{1/3}Nb_{2/3}O_3$ also known under the name of BZN.

Figure 1:
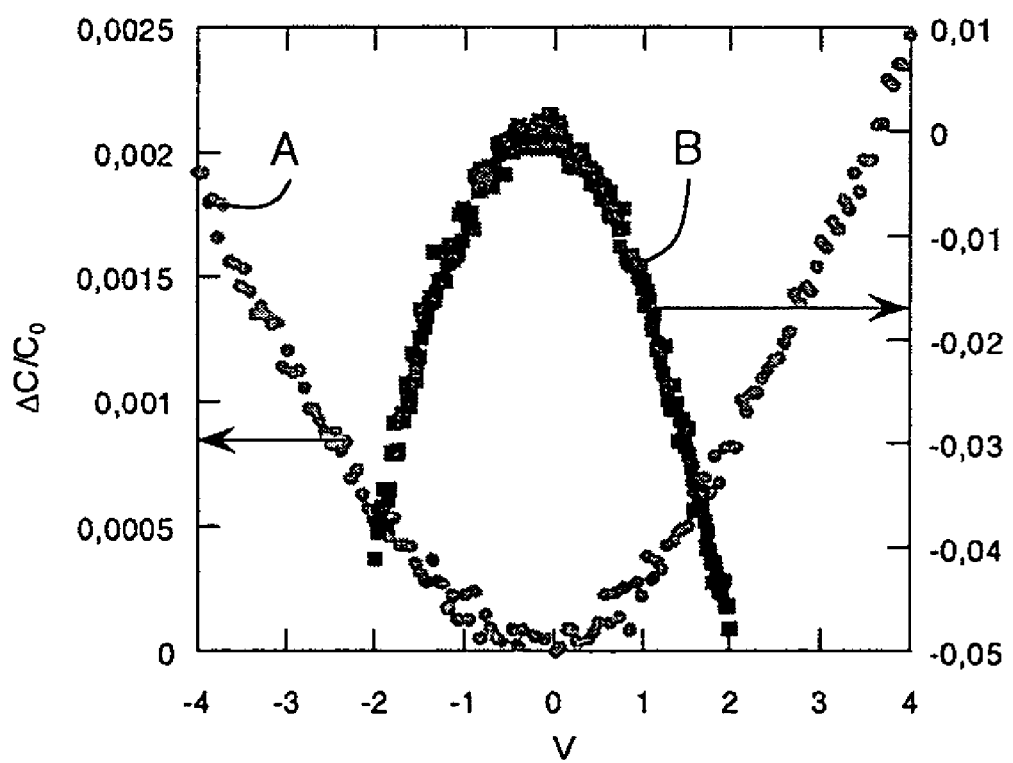
FIG. 1 represents the relative variation of the capacitance C of two capacitors each comprising a dielectric layer of $SrTiO_3$, respectively amorphous and crystalline, arranged between two platinum electrodes, versus the bias V applied.

Thus, for illustration purposes, in FIG. 1 plots A and B each represent the experimental variation of the capacitance value $\Delta C/C_0$ of a stack comprising two platinum electrodes separated by a dielectric layer of $SrTiO_3$ (STO), according to the bias V applied between the two electrodes. Plot A corresponds to the thin layer of STO in amorphous form whereas plot B corresponds to the thin layer of STO in crystalline form. The two platinum electrodes each have thickness of 100 nm and the thin layers of STO have a thickness of 100 nm.

It can be observed in FIG. 1 that plots A and B can be modeled by the general formula (1). Plot A presents an upward concaveness indicating that, for the amorphous material, coefficient $\alpha$ is positive, whereas plot B having a downward concaveness, coefficient $\alpha$ is negative for the crystalline material.

Furthermore, thicknesses $d_a$ and $d_c$ of the two thin layers formed by the same perovskite material and respectively in amorphous and crystalline form are also predetermined so as to obtain a dielectric presenting a quadratic voltage coefficient of capacitance as close to zero as possible, which improves the voltage stability of the capacitor.

Thicknesses $d_a$ and $d_c$ can for example be chosen such as to comply with the following general formulas (2) and (3):

$$d_a = \frac{\varepsilon_0 \varepsilon_a}{C_{s0}} \left( \frac{1}{1 - \left(\frac{\varepsilon_c}{\varepsilon_a}\right)^2 \frac{\gamma_a}{\gamma_c}} \right) \quad (2)$$

and $$d_c = \frac{\varepsilon_0 \varepsilon_c}{C_{s0}} \left( \frac{1}{1 - \left(\frac{\varepsilon_a}{\varepsilon_c}\right)^2 \frac{\gamma_c}{\gamma_a}} \right) \quad (3)$$

in which:

$\varepsilon_0$ corresponds to the electric constant, $\varepsilon_c$ and $\varepsilon_a$ correspond to the relative permittivity of the perovskite material respectively in crystalline form and in amorphous form, $C_{s0}$ corresponds to the total surface capacitance at zero field, and more particularly to the constant value required for the surface capacitance of the capacitor, also called target value, and $\gamma_c$ and $\gamma_a$ correspond to the quadratic coefficients of capacitance with respect to the electric field of the perovskite material respectively in crystalline form and in amorphous form.

General formulas (2) and (3) are more particularly obtained:

from the relation (4) below enabling the surface capacitance at zero field $C_{s0}$ of the stack of two thin layers to be expressed as a function of the relative dielectric constants $\varepsilon_a$ and $\varepsilon_c$ respectively of the two layers:

$$C_{s0} = \varepsilon_0 \frac{\varepsilon_a \varepsilon_c}{\varepsilon_a d_c + \varepsilon_c d_a} \qquad (4)$$

and from the general formula (5) below modeling the linearity of a dielectric thin layer as a function of the electric field.

$$\frac{C}{C_0} = \gamma E^2 + \delta E + 1 \qquad (5)$$

Coefficients $\gamma$ and $\delta$ respectively correspond to the quadratic coefficient of capacitance with respect to the electric field and to the linear coefficient of capacitance with respect to the electric field. These are parameters intrinsic to the material forming said dielectric thin layer.

The two superposed respectively amorphous and crystalline thin layers forming two capacitors in series, with the electrodes, surface capacitance Cs of the capacitor formed by the stack of two thin layers arranged between two electrodes therefore complies with the following formula:

$$C_s = \frac{C_{sa} C_{sc}}{C_{sa} + C_{sc}} \qquad (6)$$

where $C_{sa}$ corresponds to the surface capacitance of the amorphous thin layer and $C_{sc}$ corresponds to the surface capacitance of the crystalline thin layer.

Furthermore, as a first approximation, parameter $\delta$ can be ignored in formula (5) since, like parameter $\beta$, the linear effect of the bias on the capacitance value can in usual manner be canceled. Thus, according to formula (5), we also have:

$$\frac{C_{sa}}{C_{sa0}} = 1 + \gamma_a E_a^2 \qquad (7)$$

and $$\frac{C_{sc}}{C_{sc0}} = 1 + \gamma_c E_c^2 \qquad (8)$$

with $C_{sa0}$ and $C_{sr0}$ corresponding to the surface capacitance at zero field respectively of the amorphous and crystalline thin layers, $\gamma_c$ and $\gamma_a$ corresponding to the quadratic coefficients of capacitance with respect to the electric field of the thin layers respectively in crystalline form and in amorphous form, and $E_a$ and $E_c$ corresponding to the electric field applied to the thin layers respectively in crystalline form and in amorphous form.

Thus, assuming that $C_s$ is invariant according to the field applied, i.e. $Cs=C_{s0}$, formula (6) can be developed by inserting formulas (7) and (8). Moreover, the two amorphous and crystalline thin layers being superposed, conservation of the displacement vector $\vec{D}$ at the interface induces $\varepsilon_a Ea = \varepsilon_c Ec$, $\vec{D}$ being the electronic displacement vector defined by Maxwell. Furthermore, coefficients $\gamma_a$ and $\gamma_c$ being small, formula (6) can undergo a limited development. Therefore, keeping only the order 2 term in E, the following expression between the thicknesses of the amorphous and crystalline thin layers is obtained:

$$\frac{d_a}{d_c} = -\left(\frac{\varepsilon_a}{\varepsilon_c}\right)^3 \frac{\gamma_c}{\gamma_a}. \qquad (9)$$

By combining equation (6) with equation (9), formulas (2) and (3) are obtained enabling the thicknesses $d_a$ and $d_c$ of the two thin layers to be deposited to form the dielectric to be determined, for a required surface capacitance value $C_{s0}$, independent of the variation of $E^2$ and preferably greater than or equal to 5 fF/$\mu$m$^2$ and preferably greater than or equal to 10 fF/$\mu$m$^2$.

General formulas (2) and (3) therefore depend not only on the surface capacitance at zero field $C_{s0}$ corresponding to the surface capacitance required for the capacitor, but also on the coefficients $\gamma_c$ and $\gamma_a$, respectively corresponding to the quadratic coefficients with respect to the electric field of the perovskite material respectively in crystalline form and in amorphous form. It is then possible, depending on the surface capacitance required for the capacitor, to determine the thicknesses $d_a$ and $d_c$ necessary to obtain a dielectric presenting a quadratic voltage coefficient of capacitance as close to zero as possible, which enables a capacitor presenting a good voltage stability to be obtained.

Furthermore, the perovskite material used to form the dielectric can be replaced by any type of metal oxide presenting a quadratic voltage coefficient of capacitance in crystalline form of opposite sign to that of the quadratic voltage coefficient of capacitance of an amorphous form of said oxide. For example, the metal oxide can be titanium oxide. Furthermore, the dielectric can be formed by several pairs of thin layers of perovskite material or of metal oxide, respectively in crystalline form and in amorphous form.

Figure 2:
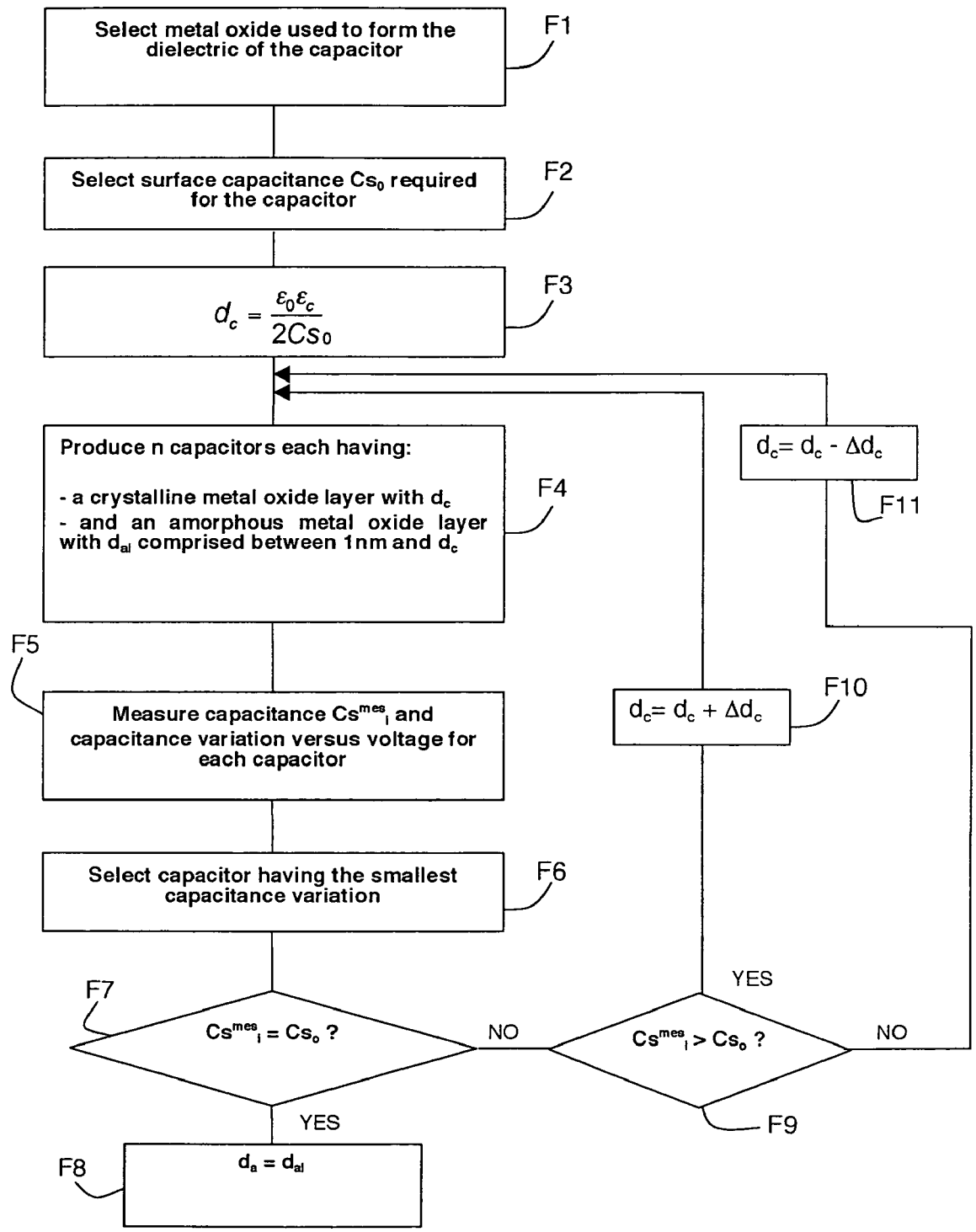
FIG. 2 represents a method for determining the respective thicknesses of the thin layers of metal oxide respectively in amorphous and crystalline form, in block diagram form.

Likewise the use of general formulas (2) and (3) to determine the thicknesses $d_a$ and $d_c$ to enable a good voltage stability to be obtained can be replaced by an empirical method such as the one represented in FIG. 2.

Depending on the metal oxide, for example a perovskite material, used to form the dielectric of the capacitor (step F1) and depending on the required surface capacitance value $Cs_0$ (step F2), the thicknesses $d_a$ and $d_c$ can be determined by producing, in a first stage (step F4), a plurality of capacitors each comprising two electrodes separated by a dielectric. The dielectric of each capacitor is formed by superposition of a thin layer of metal oxide in crystalline form and of a thin layer formed by the same metal oxide but in amorphous form.

For each capacitor, the thin layer in crystalline form has the same predetermined thickness $d_c$. This thickness $d_c$ is chosen beforehand to comply with the following formula:

$$d_c = \frac{\varepsilon_0 \varepsilon_c}{2 C s_0}$$

(step F3) where $\varepsilon_o$ corresponds to the electric constant and $\varepsilon_c$ is the dielectric constant of said metal oxide in crystalline form.

The thin layers in amorphous form of the plurality of capacitors have different predetermined thicknesses $d_{ai}$ respectively comprised between 1 nm and $d_{ci}$.

Then, in step F5, the surface capacitance $Cs^{mes}_i$ of each capacitor is measured as is the variation of the capacitance according to the applied voltage for each capacitor.

The capacitor having the smallest capacitance variation according to the applied voltage is then selected in step F6 from the plurality of capacitors. Then the value of the measured surface capacitance $Cs^{mes}_i$ of said selected capacitor is compared, in step F7, with the predetermined surface capacitance value $Cs_o$ required for the capacitor.

As indicated by the YES output of step F7, if it is observed in step F7 that the surface capacitance value $Cs^{mes}_i$ of the selected capacitor is equal to the surface capacitance value $Cs_o$ required for the capacitor, the thickness to be determined $d_a$ for the thin layer in amorphous form then corresponds to the thickness $d_{ai}$ of the thin layer in amorphous form of the selected capacitor, as indicated in step F8. In this case, the thickness to be determined $d_c$ for the thin layer in crystalline form corresponds to the value chosen in step F3.

The NO output of step F7 indicates that the value of the surface capacitance $Cs^{mes}_i$ of the selected capacitor is different from the value of the surface capacitance $Cs_o$ required for the capacitor. In this case, steps F4 to F7 are reiterated modifying the value of $d_c$ by a predetermined value $\Delta d_c$, with for example $\Delta d_c$=20%.

More particularly, an additional comparison step F9 is performed at the NO output of step F7 to determine whether the value $Cs^{mes}_i$ is greater than the value $Cs_o$. If the comparison performed in step F7 is positive (YES output of step F9), i.e. if $Cs^{mes}_i > Cs_o$, steps F4 to F7 are reiterated increasing the value of $d_c$ by $\Delta d_c$ (step F10) in order to decrease the value of $Cs^{mes}_i$. If the comparison performed in step F7 is negative (NO output of step F9), i.e. if $Cs^{mes}_i < Cs_o$, steps F4 to F7 are reiterated decreasing the value of $d_c$ by $\Delta d_c$ (step F11) in order to increase the value of $Cs^{mes}_i$.

Placing two dielectric thin layers respectively formed by the same predetermined metal oxide but in two different states in series and choosing predetermined thicknesses according to a required surface capacitance value (corresponding to $C_{s0}$) thereby enable a quadratic voltage coefficient of capacitance (coefficient α) as close as possible to zero to be obtained for the stack formed by the two thin layers. This improves the stability of the capacitor.

Furthermore, the capacitor can also have a high surface capacitance, more particularly greater than 5 fF/μm² and advantageously greater than 10 fF/μm². For example, when they are in crystalline form, perovskite materials present the advantage of having a very high relative dielectric constant $\in_r$, generally comprised between 100 and 1500. This property provides the possibility of obtaining a capacitor presenting a very high surface capacitance $Cs_o$.

Finally, production of the capacitor is facilitated by the use of the same metal oxide to form both the two thin layers. Such a capacitor can in fact be produced by means of at least the following successive steps:
    deposition of an amorphous metal oxide forming a first thin layer of predetermined thickness $d_c$ on a first electrode and crystallization by annealing,
    deposition of the same amorphous metal oxide on the first thin layer forming a second thin layer of predetermined thickness $d_a$,
    and formation of a second electrode on the second thin layer.

Crystallization by annealing can be performed after deposition of the amorphous metal oxide on the first electrode or it can be performed during deposition, in particular by in-situ heating.

Such a method facilitates production of a thin-film capacitor presenting a high stability and a high capacitance value. The dielectric is in fact formed from a single metal oxide, which enables the same deposition chamber to be used. Crystallization of the first thin layer is thereby achieved in a less costly manner. The deposition technique of the second thin layer of amorphous metal oxide can be of any type provided that it enables the metal oxide to be preserved in its amorphous form after said deposition. Certain hot deposition techniques, such as metallo-organic chemical vapor deposition (MOCVD), can therefore be used.

Figure 3:
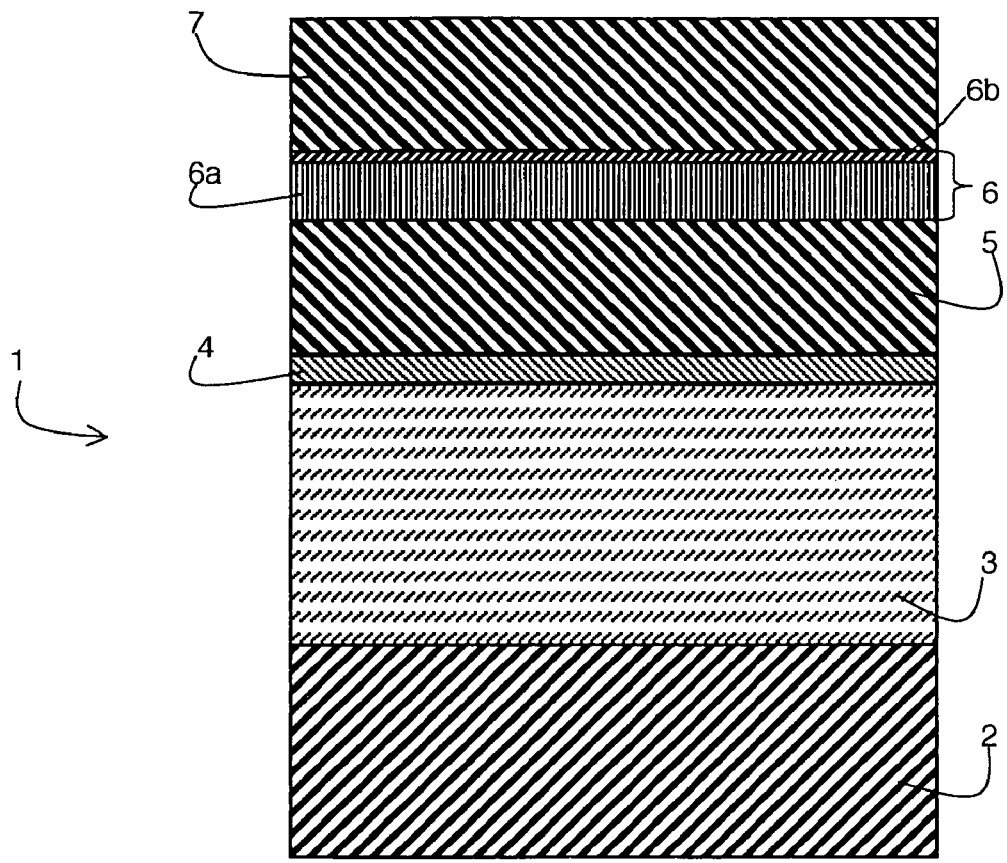
FIG. 3 schematically represents a first embodiment of a capacitor according to the invention in cross-section.

For example purposes, a thin-film capacitor 1 is illustrated in FIG. 3. It comprises a substrate 2, for example made of silicon, on which the following are successively arranged:
    an insulating thin layer 3, for example made of silicon oxide 3, with a thickness of 500 nm,
    a bonding thin layer 4, for example made of titanium oxide 3, with a thickness of 20 nm,
    a first electrode 5, for example made of platinum, with a thickness of 100 nm,
    a stack 6 formed by a thin layer 6a of crystalline SrTiO₃ (STO) of predetermined thickness $d_a$ and a thin layer 6b made of STO but in amorphous form and of predetermined thickness $d_c$,
    and a second electrode 7, for example made of platinum, with a thickness of 100 nm.

Bonding thin layer 4 more particularly enables a good adhesion of first electrode 5 on substrate 2 to be achieved.

Crystalline thin layer 6a is for example formed by depositing a thin layer of amorphous STO by Ion Beam Sputtering (IBS) at ambient temperature and performing crystallization annealing at 500° C. Amorphous thin layer 6b is for example deposited by IBS.

Figure 4:
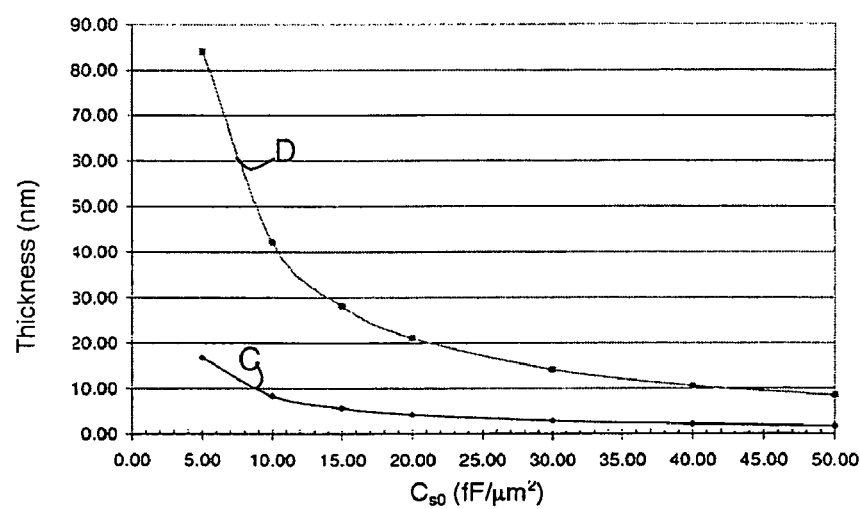
FIG. 4 represents the variation of the thickness of a thin layer of amorphous $SrTiO_3$ and of a thin layer of crystalline $SrTiO_3$ versus the surface capacitance Cs.

For the crystalline perovskite STO material, $\gamma_c = -1.6 \cdot 10^{-17}$ m²/V² and $\in_c = 100$ whereas for the amorphous STO material, $\gamma_a = 4.7 \cdot 10^{-19}$ m²/V² and $\in_a = 18$. Thus, for a surface capacitance value $Cs_o$ of 10 fF/μm², general formulas (2) and (3) enable it to be determined that the respective thicknesses $d_c$ and $d_a$ of thin layers 6a and 6b are respectively about 42 nm and 8.4 nm. This is also observed in FIG. 4 in which plots C and D are reported representing, according to general formulas (2) and (3), the variation of thicknesses $d_a$ and $d_c$ of the amorphous and crystalline STO layers versus the required surface capacitance $C_{s0}$.

Although it has already been proposed to produce capacitors comprising a dielectric in the form of two superposed thin layers made from the same perovskite material and respectively crystalline and amorphous (see Patent application US2003/0184952 and U.S. Pat. No. 6,190,924), adding the amorphous layer was in the prior art only designed to reduce leakage currents liable to occur when a crystalline layer was used. However, according to a particular embodiment of the invention, choosing predetermined thicknesses according to a required surface capacitance enables a quadratic voltage coefficient of capacitance (coefficient α) close to zero to be obtained for the stack formed by the two thin layers. This improves the voltage stability of the capacitor, making the capacitance value of the capacitor as least dependent as possible on the bias V applied to the capacitor.

Figure 5:
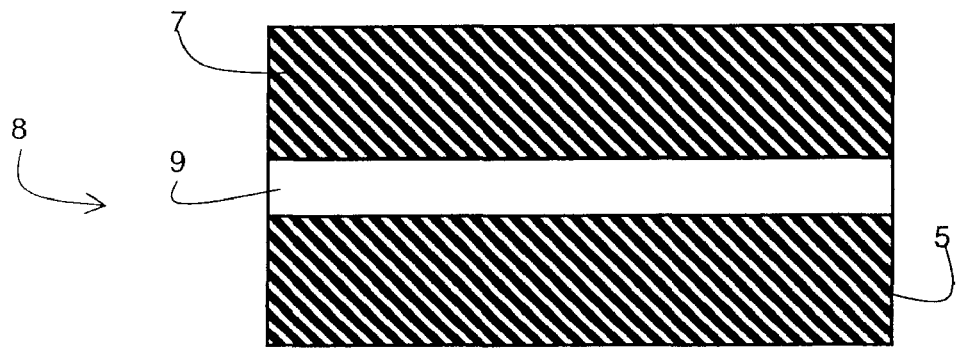
FIG. 5 schematically represents a second embodiment of a capacitor according to the invention in cross-section.

In a second embodiment as represented for example purposes in FIG. 5, a high surface capacitance, preferably greater than or equal to 10 fF/μm², and an improved voltage stability can also be achieved with a dielectric formed by a single thin layer 9 of perovskite material. The perovskite material is for example chosen from SrTiO₃, Pb(Zr, Ti)O₃, Pb(Mg, Nb)O₃—PbTiO₃, BaTiO₃, (K, Na)NbO₃, Ba₂Na₂Nb₅O₁₅ and BaZn₁/₃Nb₂/₃O₃.

As indicated in the foregoing, perovskite materials do however present a quadratic voltage coefficient of capacitance that is not zero and with a sign that varies according to the amorphous or crystalline structure. According to a particular embodiment of the invention, a thin-film capacitor can be obtained comprising a dielectric in the form of a single thin layer formed by a perovskite material, with a quadratic voltage coefficient of capacitance (coefficient α) as close as possible to zero. This is more particularly achieved by modifying the microstructure of thin layer 9 of perovskite material previously deposited on a first electrode 5 in amorphous form.

The microstructure of said thin layer 9 is modified by heat treatment, for example by laser annealing or by in-situ heating. The heat treatment can therefore be performed after deposition of thin layer 9 of amorphous perovskite material or during said deposition. However, instead of totally crystallizing thin layer 9 as before, the heat treatment is performed here at a particular predetermined temperature. This temperature corresponds to the temperature at which the transition between the crystalline phase and the amorphous phase takes place, so that the perovskite material presents a coefficient α close to zero and preferably comprised between −1000 ppm/$V^2$ and +1000 ppm/$V^2$, and advantageously between −100 ppm/$V^2$ and +100 ppm/$V^2$ and even more advantageously equal to zero.

A second electrode 7 is then formed on said thin layer 9.

Figure 6:
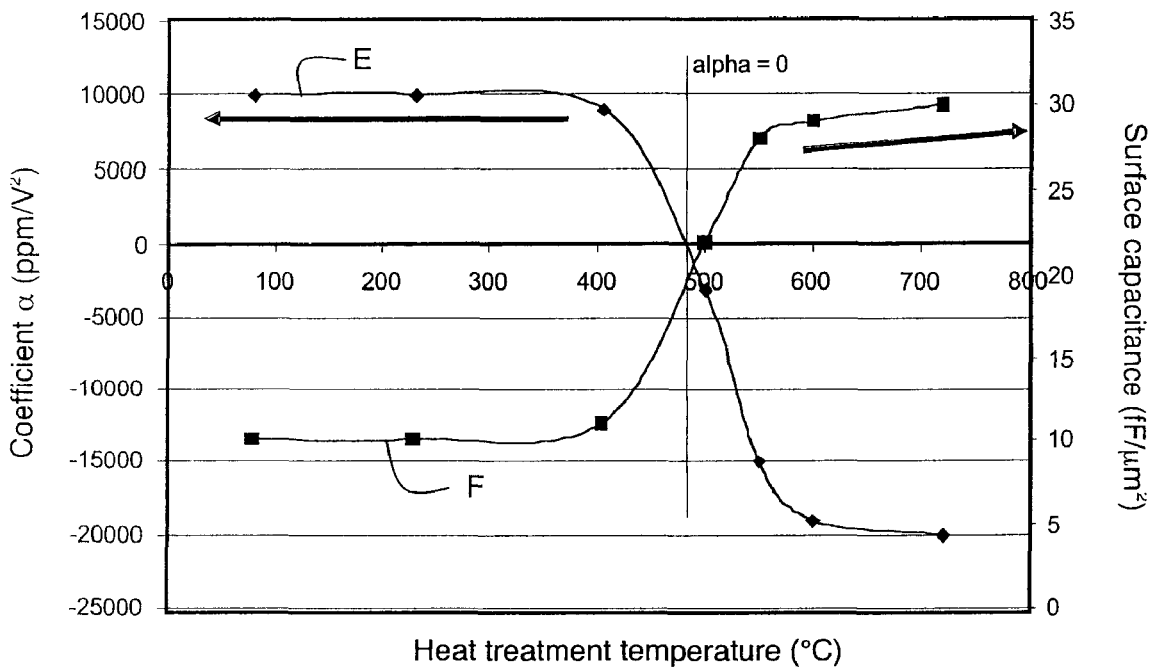
FIG. 6 represents the variation of the surface capacitance of a thin-film capacitor comprising a dielectric in the form of a thin layer of $SrTiO_3$ and the variation of the coefficient $\alpha$ of said thin layer versus the heat treatment temperature.

For example purposes, as represented in FIG. 6, a plurality of thin-film capacitors are produced by depositing a thin layer of amorphous STO with a thickness of 20 nm on a metal electrode made of platinum with a thickness of 100 nm.

For each capacitor, the thin layer of amorphous STO is subjected to heat treatment in a controlled atmosphere at a preset temperature before a second metal electrode, for example a platinum electrode with a thickness of 100 nm, is deposited. The heat treatment temperature is different for each capacitor and it varies in a range comprised between 0° C. and 800° C.

The surface capacitance is then measured for each capacitor as is coefficient α of each thin layer of STO. For example, coefficient α of each thin layer is determined by measuring the variation of the capacitance of the corresponding capacitor according to the DC voltage applied to said capacitor, with an impedance meter. Each capacitance value is recorded on a graph according to the DC voltage applied, and general formula (1)

$$\frac{C}{C_0} = \alpha V^2 + \beta V + 1$$

enables coefficient α to be extracted from the graph.

These values are reported in FIG. 6 where plot E represents the variation of coefficient α versus the heat treatment temperature whereas plot F represents the variation of the surface capacitance versus the annealing temperature.

It can be observed in FIG. 6 that coefficient α goes from −20000 ppm/$V^2$ to +10000 ppm/$V^2$ between 0° C. and 800° C. and that a temperature exists for which coefficient α is zero. The temperature corresponding to a zero value of coefficient α is 480° C. Plot F enables the surface capacitance obtained for the capacitor to be determined for this heat treatment temperature. It is about 22 fF/μm². Thus, by performing heat treatment at 480° C., the thin layer of STO presents a zero coefficient α and the surface capacitance of the capacitor containing such a thin layer is 22 fF/μm².

The perovskite material used to form the dielectric in the second embodiment can be replaced by any type of metal oxide which, when subjected in amorphous form to heat treatment at a preset temperature, presents a coefficient α close to zero and preferably comprised between −1000 ppm/$V^2$ and +1000 ppm/$V^2$ and advantageously between −100 ppm/$V^2$ and +100 ppm/$V^2$ and even more advantageously equal to zero. The metal oxide is for example titanium oxide.

The invention claimed is:

1. A thin film capacitor comprising at least two electrodes separated by a dielectric formed by superposition of at least two thin layers respectively presenting quadratic voltage coefficients of capacitance of opposite signs,
wherein the two thin layers are made of a same metal oxide, respectively in crystalline form and in amorphous form, the respective thicknesses $d_a$ and $d_c$ of the amorphous and crystalline thin layers complying with the following general formulas:

$$d_a = \frac{\varepsilon_0 \varepsilon_a}{C_{s0}} \left( \frac{1}{1 - \left(\frac{\varepsilon_c}{\varepsilon_a}\right)^2 \frac{\gamma_a}{\gamma_c}} \right) \text{ and } d_c = \frac{\varepsilon_0 \varepsilon_c}{C_{s0}} \left( \frac{1}{1 - \left(\frac{\varepsilon_a}{\varepsilon_c}\right)^2 \frac{\gamma_c}{\gamma_a}} \right)$$

where:
$\varepsilon_0$ corresponds to the electric constant,
$\varepsilon_c$ and $\varepsilon_a$ respectively correspond to the relative permittivity of the metal oxide in crystalline form and the relative permittivity of the metal oxide in amorphous form, $C_{s0}$ corresponds to the total surface capacitance at zero field,
$\gamma_c$ and $\gamma_a$ correspond to the quadratic coefficients of capacitance in function to the electric field of the metal oxide respectively in crystalline form and in amorphous form.

2. The capacitor according to claim 1, wherein the metal oxide is selected from the group consisting in a perovskite material and titanium oxide.

3. The capacitor according to claim 2, wherein the perovskite material is selected from the group consisting of $SrTiO_3$, $Pb(Zr, Ti)O_3$, $Pb(Mg, Nb)O_3$—$PbTiO_3$, $BaTiO_3$, $(K, Na)NbO_3$, $Ba_2Na_2Nb_5O_{15}$ and $BaZn_{1/3}Nb_{2/3}O_3$.

4. A method for producing a thin-film capacitor, wherein it comprises at least the following successive steps:
deposition of an amorphous metal oxide forming a first thin layer of a predetermined thickness $d_c$ on a first electrode and crystallization by annealing,
deposition of the same amorphous metal oxide on the first thin layer forming a second thin layer of a predetermined thickness $d_a$,
and formation of a second electrode on the second thin layer,
and wherein the thicknesses $d_a$ and $d_c$ respectively comply with the following general formulas:

$$d_a = \frac{\varepsilon_0 \varepsilon_a}{C_{s0}} \left( \frac{1}{1 - \left(\frac{\varepsilon_c}{\varepsilon_a}\right)^2 \frac{\gamma_a}{\gamma_c}} \right) \text{ and } d_c = \frac{\varepsilon_0 \varepsilon_c}{C_{s0}} \left( \frac{1}{1 - \left(\frac{\varepsilon_a}{\varepsilon_c}\right)^2 \frac{\gamma_c}{\gamma_a}} \right)$$

where:
$\varepsilon_0$ corresponds to the electric constant,
$\varepsilon_c$ and $\varepsilon_a$ respectively correspond to the relative permittivity of the metal oxide in crystalline form and to the relative permittivity of the metal oxide in amorphous form, $C_{s0}$ corresponds to the total surface capacitance at zero field, $\gamma_c$ and $\gamma_a$ correspond to the quadratic coefficients of capacitance in function to the electric field of the metal oxide respectively in crystalline form and in amorphous form.

5. The method according to claim 4, wherein crystallization by annealing is performed after deposition of the amorphous metal oxide on the first electrode.

6. The method according to claim 4, wherein crystallization by annealing is performed at the same time as deposition of the amorphous metal oxide on the first electrode.

7. A method for determining respective thicknesses of two superposed thin layers made from a same metal oxide respectively in crystalline and amorphous form and forming the dielectric of a thin-film capacitor having a predetermined value of surface capacitance $Cs_o$, method wherein it comprises at least the following successive steps:

fixing the thickness $d_c$ of the thin layer of metal oxide in crystalline form to a value equal to $$\frac{\varepsilon_0 \varepsilon_c}{2Cs_0}$$

where $\in_o$ corresponds to the electric constant and $\in_c$ is the dielectric constant of said metal oxide in crystalline form b) producing a plurality of capacitors each comprising two electrodes separated by a dielectric formed by superposition:

of a thin layer of metal oxide in crystalline form of thickness $d_c$ and a thin layer of metal oxide in amorphous form having a predetermined thickness $d_{ai}$ comprised between 1 nm and $d_c$ that is different for each capacitor measuring the surface capacitance $Cs^{mes}_i$ of each capacitor and measuring the variation of the capacitance in function to the applied voltage for each capacitor selecting the capacitor having the smallest capacitance variation in function to the applied voltage, from the plurality of capacitors comparing the measured surface capacitance $Cs^{mes}_i$ of the selected capacitor with the predetermined value of surface capacitance $Cs_o$:

if $Cs^{mes}_i = Cs_o$, the thickness to be determined for the thin layer in amorphous form corresponds to the thickness $d_{ai}$ of the thin layer in amorphous form of the selected capacitor and the thickness to be determined for the thin layer in crystalline form corresponds to the thickness $d_c$, if not, steps b) to e) are reiterated modifying the value of $d_c$ by a predetermined value $\Delta d_c$.

8. The method according to claim 7, wherein, if $Cs^{mes}_i > Cs_o$, steps b) to e) are reiterated increasing the value of $d_c$ by $\Delta d_c$.

9. The method according to claim 7, wherein if $Cs^{mes}_i < Cs_o$, steps b) to e) are reiterated decreasing the value of $d_c$ by $\Delta d_c$.

* * * * *